United States Patent [19]
Furumiya

[11] Patent Number: 5,844,290
[45] Date of Patent: Dec. 1, 1998

[54] SOLID STATE IMAGE PICK-UP DEVICE AND METHOD FOR MANUFACTURING THE SAME

[75] Inventor: Masayuki Furumiya, Tokyo, Japan

[73] Assignee: NEC Corporation, Japan

[21] Appl. No.: 885,462

[22] Filed: Jun. 27, 1997

[30] Foreign Application Priority Data

Jun. 27, 1996 [JP] Japan .................................. 8-167672

[51] Int. Cl.[6] .................. H01L 27/148; H01L 29/768; H01L 31/0232
[52] U.S. Cl. ..................... 257/432; 257/222; 257/233
[58] Field of Search ................................ 257/222, 223, 257/232, 233, 432

[56] References Cited

U.S. PATENT DOCUMENTS

| | | | |
|---|---|---|---|
| 5,323,052 | 6/1994 | Koyama | 257/432 |
| 5,371,397 | 12/1994 | Maegawa et al. | 257/233 |
| 5,691,548 | 11/1997 | Akio | 257/233 |
| 5,739,548 | 4/1998 | Shigeta et al. | 257/432 |

FOREIGN PATENT DOCUMENTS 4343470  11/1992  Japan .............................. H01L 27/14

*Primary Examiner*—Gene M. Munson
*Attorney, Agent, or Firm*—Hayes, Soloway, Hennessey, Grossman & Hage, P.C.

[57] ABSTRACT

A solid state image pick-up device comprises an array of a plurality of photodiodes formed on a principal surface of a semiconductor substrate, a planarizing resin layer covering the principal surface of the semiconductor substrate, and a plurality of micro lens formed on the planarizing resin layer, each of micro lens being positioned to correspond to one of the photoelectric conversion elements. The planarizing resin layer is composed of a first region of a first refractive index sandwiched between each of the micro lens and the corresponding photodiode, and a second region surrounding the first region, the second region having a second refractive index larger than the first refractive index.

5 Claims, 12 Drawing Sheets

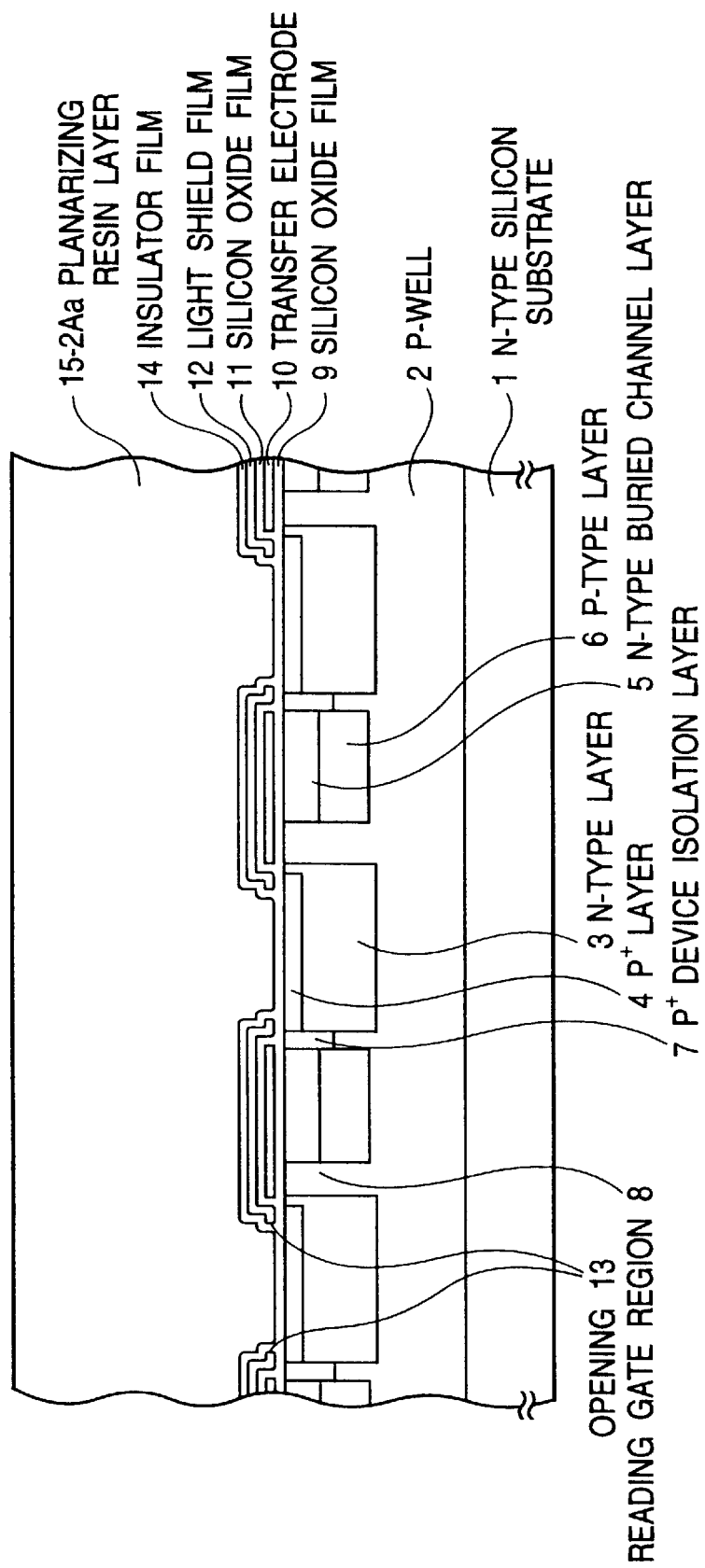

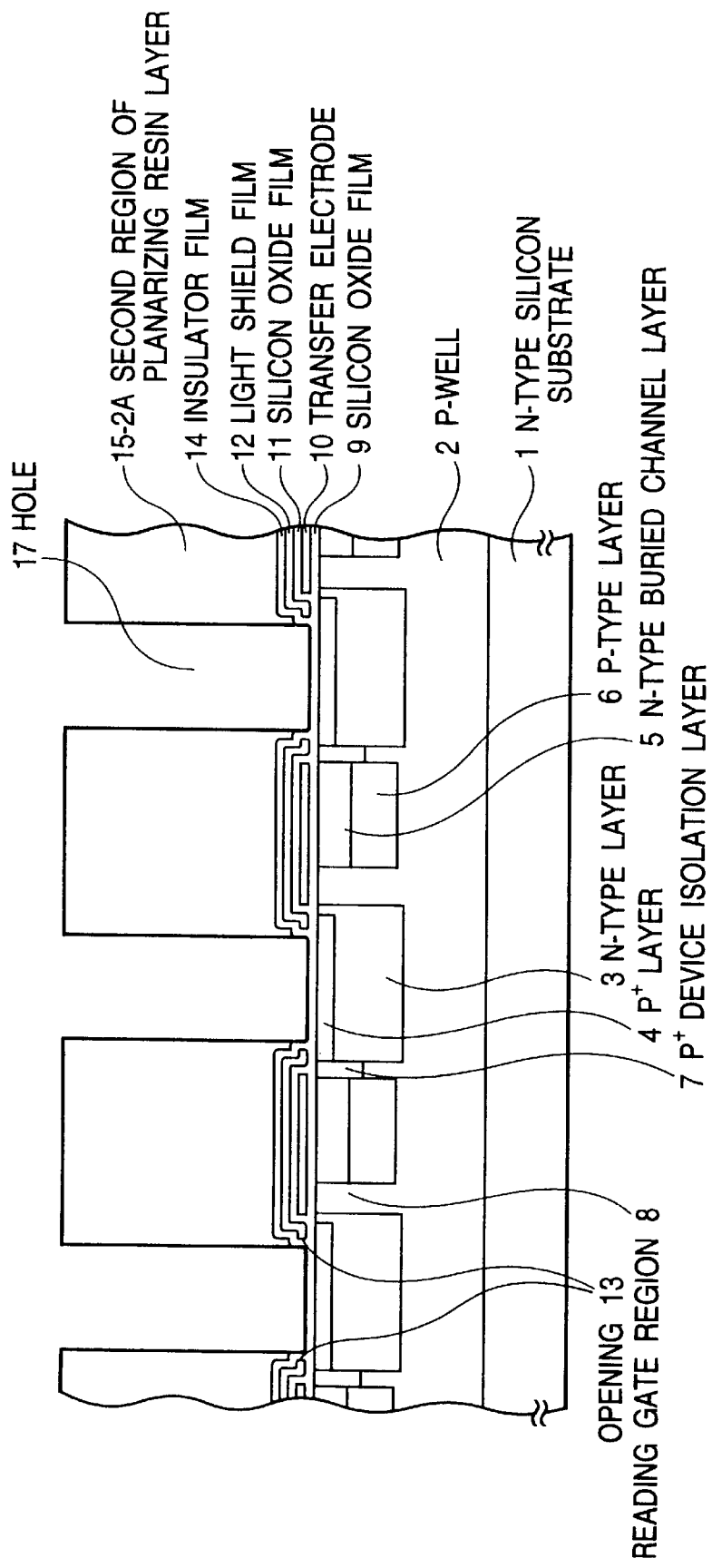

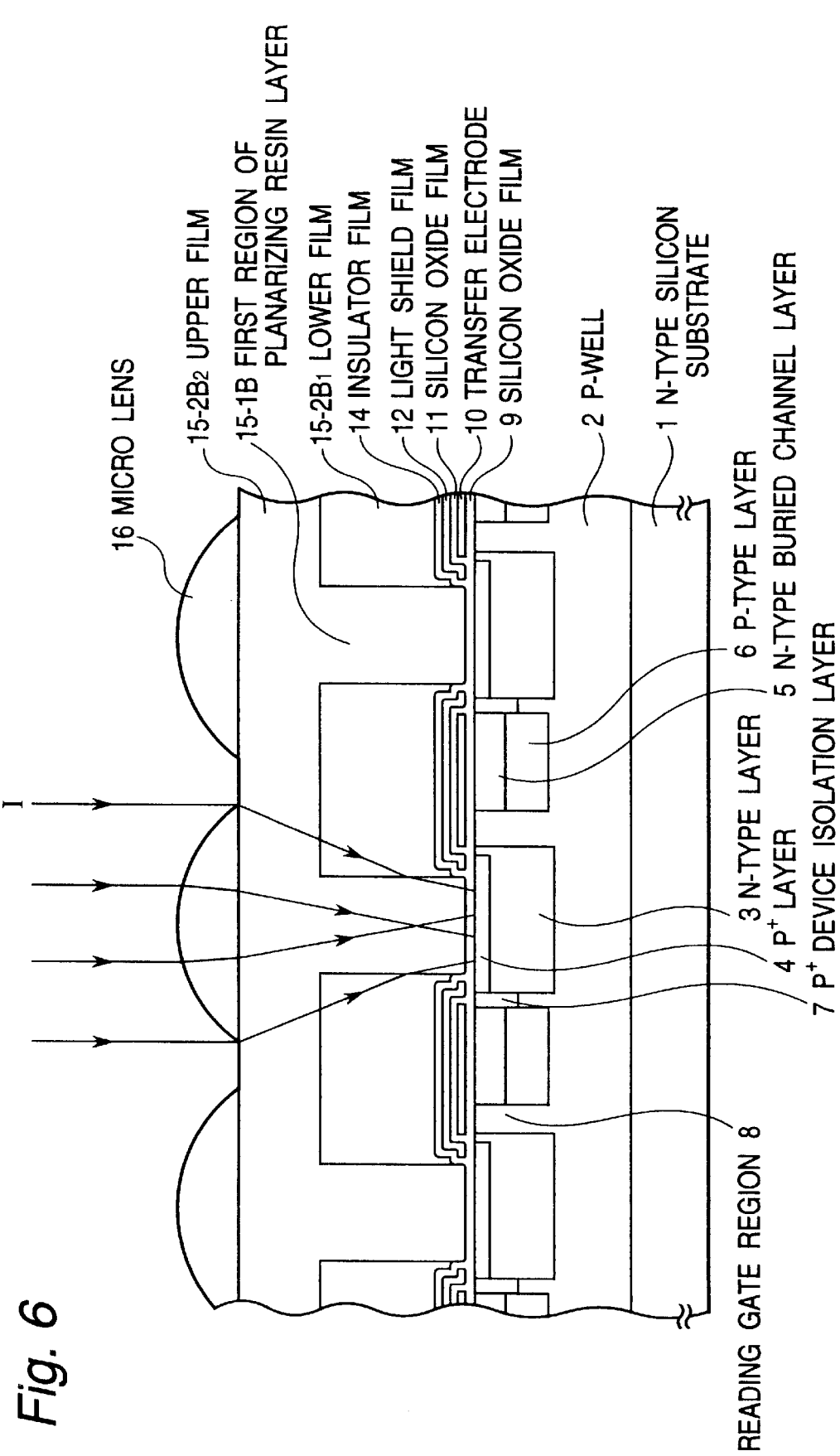

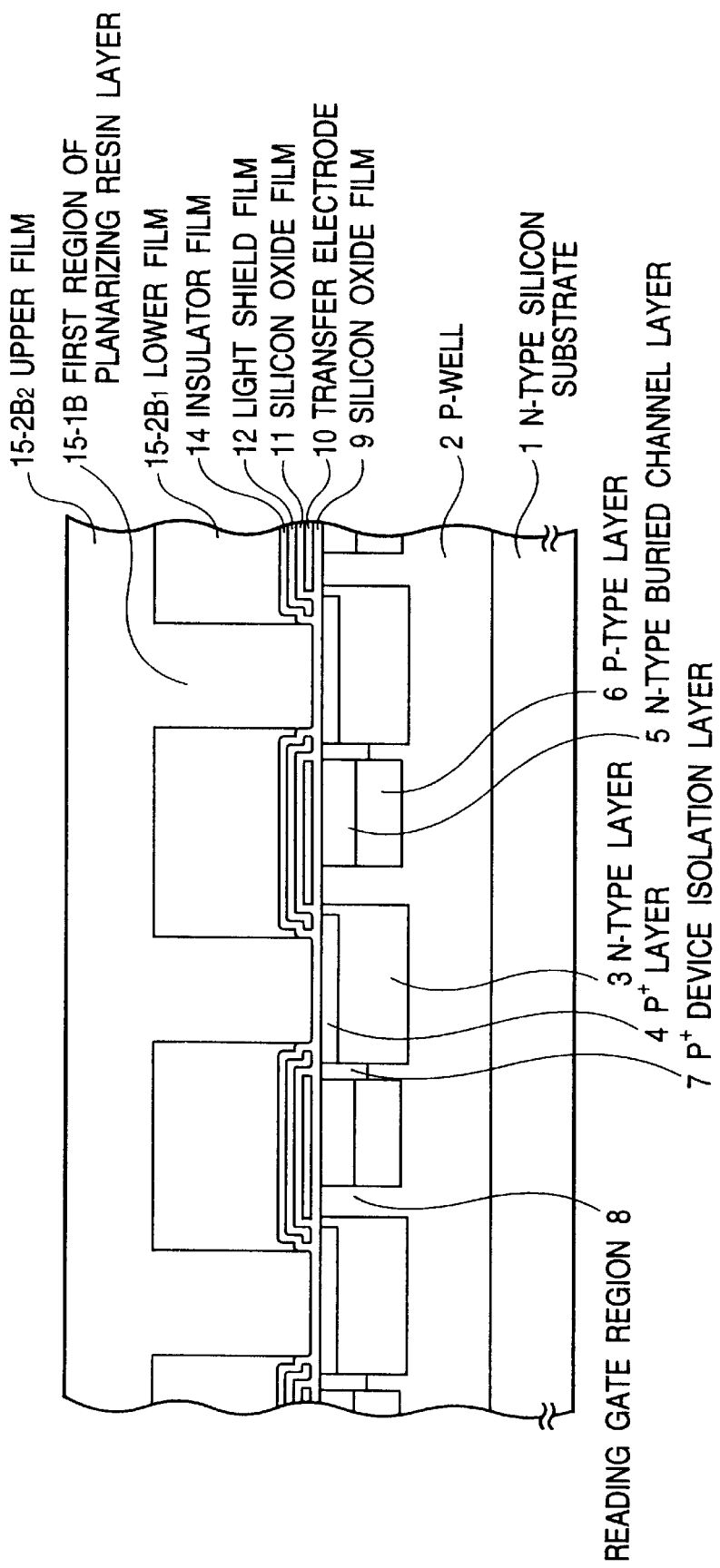

SOLID STATE IMAGE PICK-UP DEVICE AND METHOD FOR MANUFACTURING THE SAME

BACKGROUND OF THE INVENTION

1. Field of the Invention

The present invention relates to a solid state image pick-up device and a method for manufacturing the same. More specifically, the present invention relates to elevating of sensitivity and lowering of smear in the solid state image pick-up device.

2. Description of Related Art

Recently, with reduction in size of the solid state image pick-up device, a pixel size is correspondingly reduced. For example, in the case of a 200 million pixel CCD image pick-up device configured to meet a so called hi-vision (high definition television), the pixel size is of 7.3 $\mu$m (H)×7.6 $\mu$m (H) in a 1-inch optical format and of 5.0 $\mu$m (H)×5.2 $\mu$m (H) in a ⅔-inch optical format. Namely, from the 1-inch optical format to the ⅔-inch optical format, the pixel size is reduced to 70% in dimension and to 50% in area. The reduction of the pixel area to a half, means reduction of sensitivity to a half, and therefore, results in a drop of an S/N ratio. Accordingly, a problem is how to maintain the sensitivity even of the pixel size is reduced.

Referring to FIG. 1, there is shown a diagrammatic sectional view illustrating a few pixels of a prior art interline transfer type CCD image pick-up device (called a "first prior art example" hereinafter). In a surface region of an N-type silicon substrate 1, a P-type well 2 is formed, in which, as shown in FIG. 1, there are formed an N-type layer 3 of a photodiode for a photoelectric conversion and for storing an electric charge generated by the photoelectric conversion, an N-type buried channel layer 5 of a vertical CCD register for transferring the electric charge, and a reading gate region 8 for transferring the electric charge from the N-type layer 3 of the photodiode to the N-type buried channel layer 5 of the CCD register. Under the N-type buried channel layer 5, a P-type layer 6 is formed, and a P$^+$ layer 4 is formed at a surface of the photodiode and which is directly connected to a P$^+$ device isolation layer 7. On the N-type buried channel layer 5 of the vertical CCD register, an insulator film such as a silicon oxide film 9 is formed, on which a vertical CCD transfer electrode 10 is formed. In addition, on the vertical CCD transfer electrode 10, another insulator film such as a silicon oxide film 11 is formed, on which a light shield film 12 is formed. This light shield film 12 has an opening 13 in alignment with each photodiode. Furthermore, a planarizing resin layer 15 is formed to cover the whole, and a micro lens 15 is formed on the planarizing resin layer 15 in alignment with each opening 13, so that an incident light I is collected or focused to passes through the opening 13 and to enter to the N-type layer 3 of the photodiode.

In the interline transfer type CCD image pick-up device and in a frame interline transfer type CCD image pick-up device, within each one pixel there are formed the photodiode for the photoelectric conversion, the vertical CCD register for the electric charge transfer, the device isolation region for isolating these elements from each other, and the reading gate region for transferring the electric charge from the photodiode to the vertical CCD register. Therefore, in the ⅔-inch optical format image pick-up device for the hi-vision, the photodiode is as small as 2 $\mu$m in a horizontal direction size.

In addition, the surface of the vertical CCD register is provided with the transfer electrode formed of polysilicon, which makes the vertical CCD register operable, if the light enters into the CCD register, photoelectric conversion occurs, which increases noise. Therefore, the light shield film is formed to completely cover the transfer electrode. This light shield film extends so that an end of the light shield film reaches above the photodiode. Furthermore, if the light entering the N-type layer of the photodiode leaks into the vertical CCD register, photoelectric conversion occurs in the inside of the vertical CCD register, so that a spurious signal is generated. In order to suppress generation of this spurious signal, it is necessary-to cause the end of the light shield film to project over the photodiode. As a result, the size in a plan view of a portion through which the incident light passes, namely, the width of the opening formed in the light shield film, becomes about 1 $\mu$m, and the usage efficiency of the incident light drops.

For the purpose of preventing the drop of the sensitivity caused by the small opening width, the prior art example was so constructed that the planarizing resin layer and the micro lens are formed above each photodiode, and the size of the micro lens is made larger than the opening width formed in the light shield, so that the incident light is effectively collected and focused to the photodiode, for elevation of the usage efficiency of the incident light. In particular, in order to efficiently collect the incident light to the photodiode surface, the designing was made while considering the thickness of the planarizing resin layer, and the curvature and the refractive index of the micro lens.

Generally, the light which has passed through a camera lens system is projected onto an image pick-up device. When an aperture stop of the camera lens system is narrowed, the light enters perpendicularly onto the image pick-up device, in the form of a collimated light "I" having no divergence. In ordinary cases, the thickness of the planarizing resin layer and the curvature of the micro lens are so designed that when the collimated light "I" enters, all of the incident light is collected and focused within the opening 13 of the light shield film 12. However, when the aperture stop of the camera lens system is enlarged, not only the collimated light "I" but also a slant light "II" enter the image pick-up device. In this case, a portion of the incident light is blocked by the light shield film, so that an increased proportion of the light are not focused within the opening 13 of the light shield film, with the result that sensitivity drops. In other words, the sensitivity has a dependency to the aperture stop.

It is extremely difficult to design to ceaselessly cause all the incident light to be collected within the opening 13 of the, light shield film, regardless of the degree of the aperture stop of the camera lens system, by suitably selecting the thickness of the planarizing resin layer 15 and the curvature of the micro lens 16. In addition, when the amount of the slant light is large, the amount of the light entering the N-type layer of the photodiode to leak into the N-type buried channel layer 5 of the vertical CCD register 5, the smear phenomenon increases.

In order to the above mentioned problem, Japanese Patent Application Pre-examination Publication No. JP-A-04-343470, (an English abstract of which is available from the Japanese Patent Office, and the content of the English abstract of JP-A-04-343470 is incorporated by reference in its entirety into this application) propose to form the planarizing resin layer of a plurality of stacked resin layers having different refractive indexes.

Referring to FIG. 2, there is shown a diagrammatic sectional view of a few pixels of another prior art interline transfer type CCD image pick-up device proposed by JP-A-04-343470 (called a "second prior art example" hereinafter). In FIG. 2, elements corresponding to those shown in FIG. 1 are given the same Reference Numerals, and explanation thereof will be omitted for simplification of description. In the second prior art example, the planarizing layer is composed of two stacked layers 15-1 and 15-2, a lower 15-2 having a refractive index larger than that of an upper layer 15-1.

With this arrangement, if the curvature of the micro lens 16 and the thickness of the planarizing resin layers are so designed that the collimated light "I" enters within the opening of the light shield film with a sectional size as close as possible to the opening, even when the aperture stop of the camera lens system is enlarged near to a full-open condition, the incident light enters within the opening of the light shield film in a condition close to the perpendicularly incident condition. Thus, since the incident light can be collected onto the photodiode regardless of the degree of aperture stop of the camera lens system, the dependency of the sensitivity upon the degree of aperture stop can be eliminated. In addition, even when the aperture stop of the camera lens system is made near to the full-open condition, since a slant light component entering a peripheral portion of the opening of the light shield film becomes near to a perpendicular entrance, the light can be prevented from leaking into the N-type buried channel layer of the vertical CCD register, so that deterioration by the smearing can be avoided.

However, when the incident light is made near to the perpendicular entrance by adjusting the respective refractive indexes of the stacked planarizing resin layers, reflection occurs at a boundary between the planarizing resin layers, which the transmitted light reaching the opening of the light shield film is weakened, and therefore, the sensitivity lowers.

Here, reflectance factor at the boundary between the planarizing resin layers having different refractive indexes is expressed as follows:

$\{n_2-n_1\} / \{n_2+n_1\}$ where $n_1$ is the refractive index of the upper planarizing resin layer 15-1 and $n_2$ is the refractive index of the lower planarizing resin layer 15-2.

For example, assuming that $n_1=1.4$ and $n_2=1.6$, the reflectance factor at the boundary is expressed by $\{1.6-1.4\} / \{1.6+1.4\}$, namely, about 7%. In other words, transmittance at the boundary becomes 93%, and the sensitivity drops by 7%.

Accordingly, in order to approach the incident light entering the opening of the photodiode to the perpendicular entrance, the larger the number of the planarizing resin layers having different refractive indexes is made, the smaller the amount of the incident light entering the opening of the photodiode becomes, because of the reflection at the boundary between each pair of planarizing resin layers contacting to each other. As a result, the sensitivity drops inevitably.

SUMMARY OF THE INVENTION

Accordingly, it is an object of the present invention to provide a solid state image pick-up device which has overcome the above mentioned defect of the conventional one, and a method for manufacturing the same.

Another object of the present invention is to provide a solid state image pick-up device capable of minimizing the lowering of the sensitivity caused by the smearing, and a method for manufacturing the same.

The above and other objects of the present invention are achieved in accordance with the present invention by a solid state image pick-up device comprising:

a semiconductor substrate having a principal surface and a pixel array composed of a plurality of photoelectric conversion elements formed on the principal surface in the form of an array and transfer means located adjacent to the array of the photoelectric conversion elements for reading out a signal electric charge from each of the photoelectric conversion elements to transferring the read-out signal electric charge through the transfer means;

a planarizing resin layer covering the principal surface of the semiconductor substrate; and a plurality of micro lens formed on the planarizing resin layer, each of micro lens being positioned to correspond to one of the photoelectric conversion elements, the planarizing resin layer being composed of a first region of a first refractive index sandwiched between each of the micro lens and the corresponding photoelectric conversion element, and a second region surrounding the first region, the second region including a portion having a second refractive index larger than the first refractive index.

The second region can be composed of only the portion having the second refractive index larger than the first refractive index. Alternatively, the second region can be composed of a lower layer portion at the side of the semiconductor substrate and an upper layer portion at the side of the micro lens, the lower layer portion having the first refractive index and the upper layer portion having the second refractive index.

According to another aspect of the present invention, there is provided a method for manufacturing a solid state image pick-up device, comprising the steps of:

preparing a semiconductor substrate having a principal surface and a pixel array composed of a plurality of photoelectric conversion elements formed on the principal surface in the form of an array and transfer means located adjacent to the array of the photoelectric conversion elements for reading out a signal electric charge from each of the photoelectric conversion elements to transferring the read-out signal electric charge through the transfer means;

forming a first resin layer having a predetermined refractive index and covering the principal surface of the semiconductor substrate;

selectively removing the first resin layer to form a plurality of holes each of which passes through the first resin layer to reach the corresponding photoelectric conversion element;

forming a second resin layer having a refractive index smaller than the predetermined refractive index, at least to fill the plurality of holes, so that a planarizing resin layer is formed of the first and second resin layers; and forming a plurality of micro lens on the planarizing resin layer in such a manner that each of the micro lens is positioned in alignment with the corresponding hole and therefore the corresponding photoelectric conversion element.

In this case, the second resin layer can be formed only to fill the holes formed in the first resin layer, or alternatively, not only to fill the holes formed in the first resin layer, but also to cover a surface of the first resin layer other than the holes formed in the first resin layer.

With the above mentioned arrangement, since the first region directly under a center region of each micro lens has only one refractive index, there is no reflection at an interlayer boundary between planarizing resin layers. On the other hand, a portion of the planarizing resin layer directly under a peripheral portion of each micro lens is formed of the second region of a large refractive index, an incident angle of the light entering the peripheral portion of the micro lens, to the photoelectric conversion element, becomes small, namely, near to a perpendicular entrance.

The above and other objects, features and advantages of the present invention will be apparent from the following description of preferred embodiments of the invention with reference to the accompanying drawings.

BRIEF DESCRIPTION OF THE DRAWINGS

FIGS. 5A, 5B and 5C are diagrammatic sectional views for illustrating a process of manufacturing the first embodiment of the solid state image pick-up device in accordance with the present invention;

FIG. 6 is a diagrammatic sectional view of a second embodiment of the solid state image pick-up device in accordance with the present invention;

FIGS. 8A, 8B and 8C are diagrammatic sectional views for illustrating a process of manufacturing the second embodiment of the solid state image pick-up device in accordance with the present invention.

DESCRIPTION OF THE PREFERRED EMBODIMENTS

Figure 1:
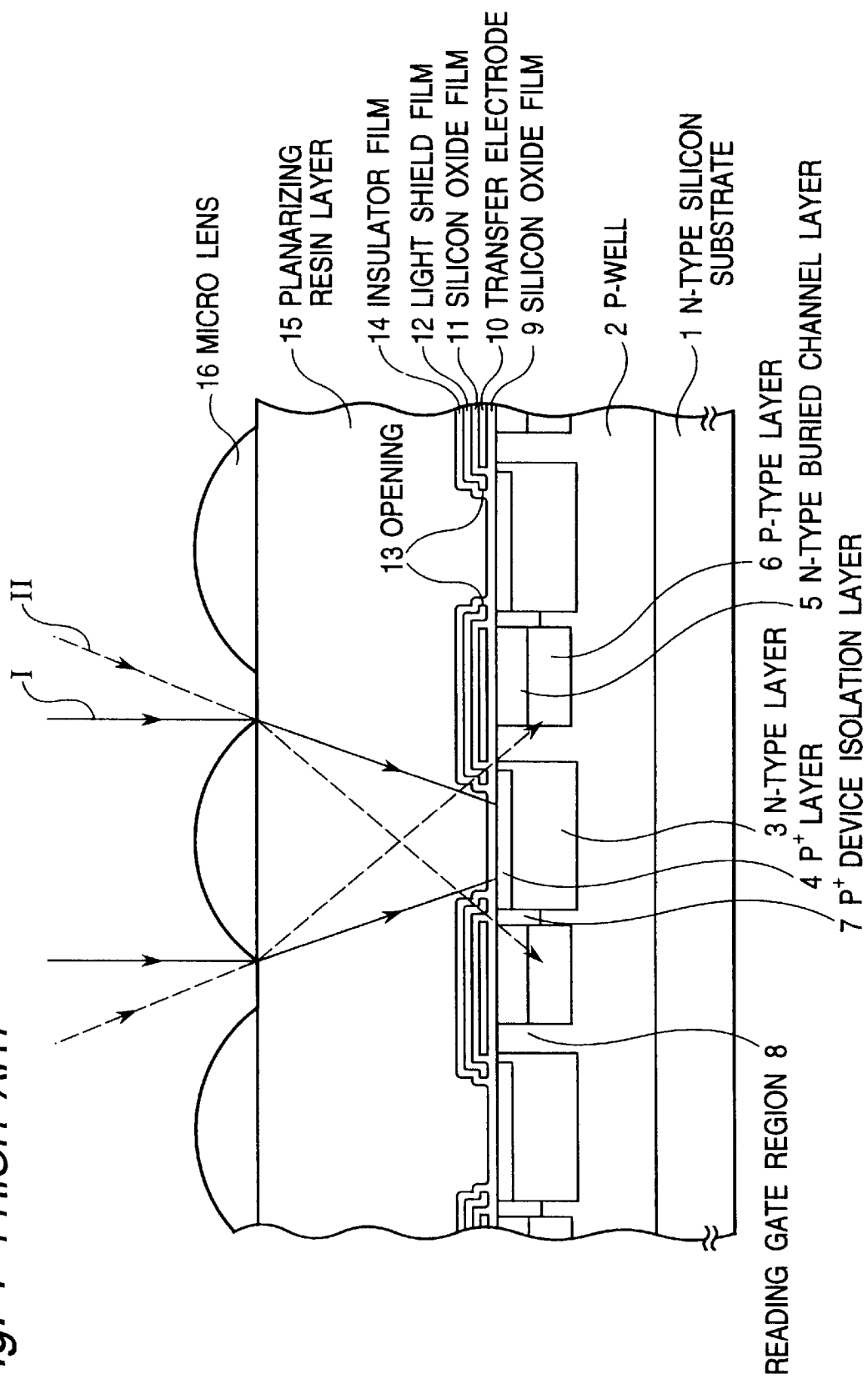
FIG. 1 is a diagrammatic sectional view of the first prior art solid state image pick-up device.
Figure 2:
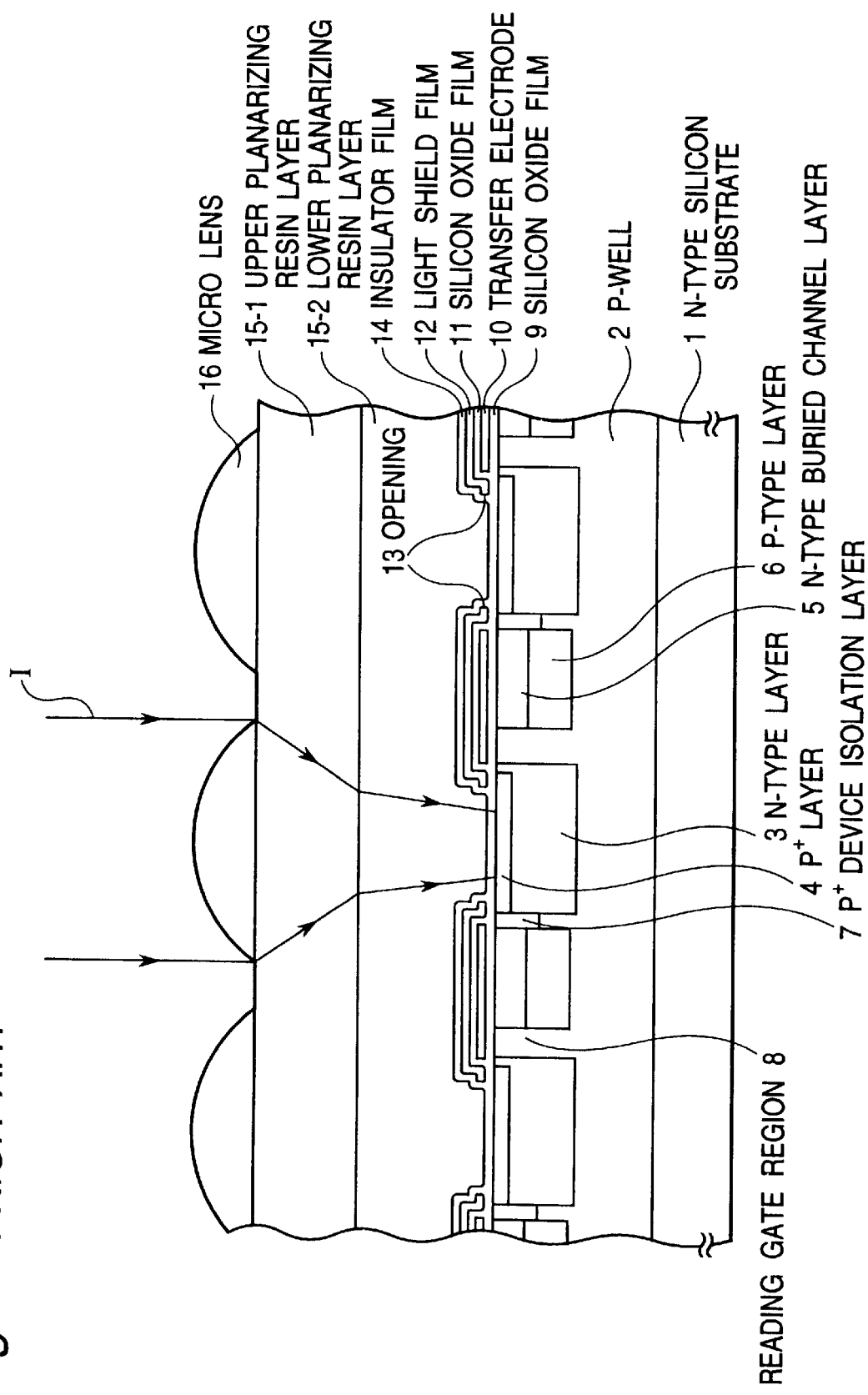
FIG. 2 is a diagrammatic sectional view of the second prior art solid state image pick-up device.
Figure 3:
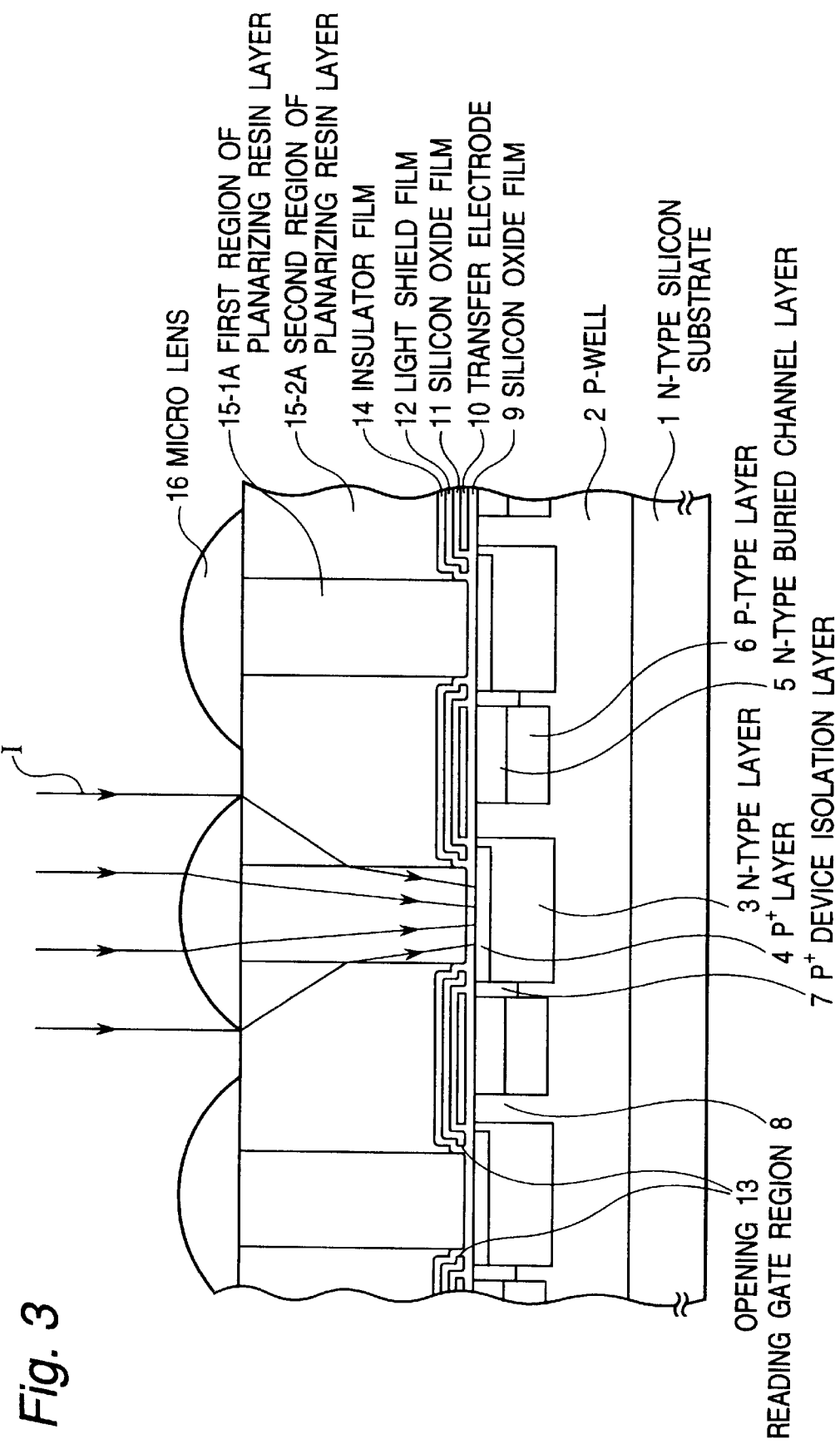
FIG. 3 is a diagrammatic sectional view of a first embodiment of the solid state image pick-up device in accordance with the present invention.

Referring to FIG. 3, there is shown a diagrammatic sectional view of a first embodiment of the solid state image pick-ups device in accordance with the present invention. In FIG. 3, elements corresponding to those shown in FIGS. 1 and 2 are given the same Reference Numerals.

The first embodiment of the solid state image pick-up device includes an N-type silicon substrate 1 having a P-well 2 formed in a principal surface thereof. At a surface region of the P-well 2, a plurality of N-type layers 3 are formed to extend in a direction perpendicular to the drawing, so as to constitute a plurality of photodiode arrays. At a surface of the N-type layers 3, a dark current suppressing P+ layer 4 is formed. In parallel to each of the photodiode arrays, an N-type buried channel layer 5 is formed, and at a bottom of the N-type buried channel layer 5, a P-type layer 6 is formed.

A vertical CCD register is constituted of the N-type buried channel layer 5 and a group of transfer electrodes cover the N-type buried channel layer 5 through a silicon oxide film 9. In FIG. 3, there is shown one transfer electrode 10 which extends over a reading gate region 8 and therefore which also functions as a reading gate electrode. A pixel array is constituted of the photodiode array and the vertical CCD register.

A P+ device isolation layer 7 is formed to isolate between the N-type layers 3 adjacent to each other and to isolate between the N-type layer 3 and the N-type buried channel layer 5. But, the P+ device isolation layer 7 is not formed in reading gate region 8 between the N-type layer 3 and the N-type buried channel layer 5.

On the transfer electrodes of the vertical CCD register, a silicon oxide film 11 is formed, and a light shield film 12 is formed on the silicon oxide film 11. This light shield film 12 has a plurality of opening 13 each in alignment with a corresponding N-type layer 3. The substrate thus formed, namely, a semiconductor chip is covered with an insulator film 14, and also covered with a planarizing resin layer (composed of a first region 15-1A and a second region 15-2A). On the planarizing resin layer, a plurality of micro lens 16 are formed each in alignment with a corresponding N-type layer 3 and therefore a corresponding opening 13.

The first region 15-1A is in the form of a cylindrical column and is positioned between the N-type layer 3 and a center portion of the micro lens 16. The second region 15-2A surrounding the first region 15-1A has a refractive index $n_2$ larger than a refractive index $n_1$ of the first region 15-1A.

Figure 4:
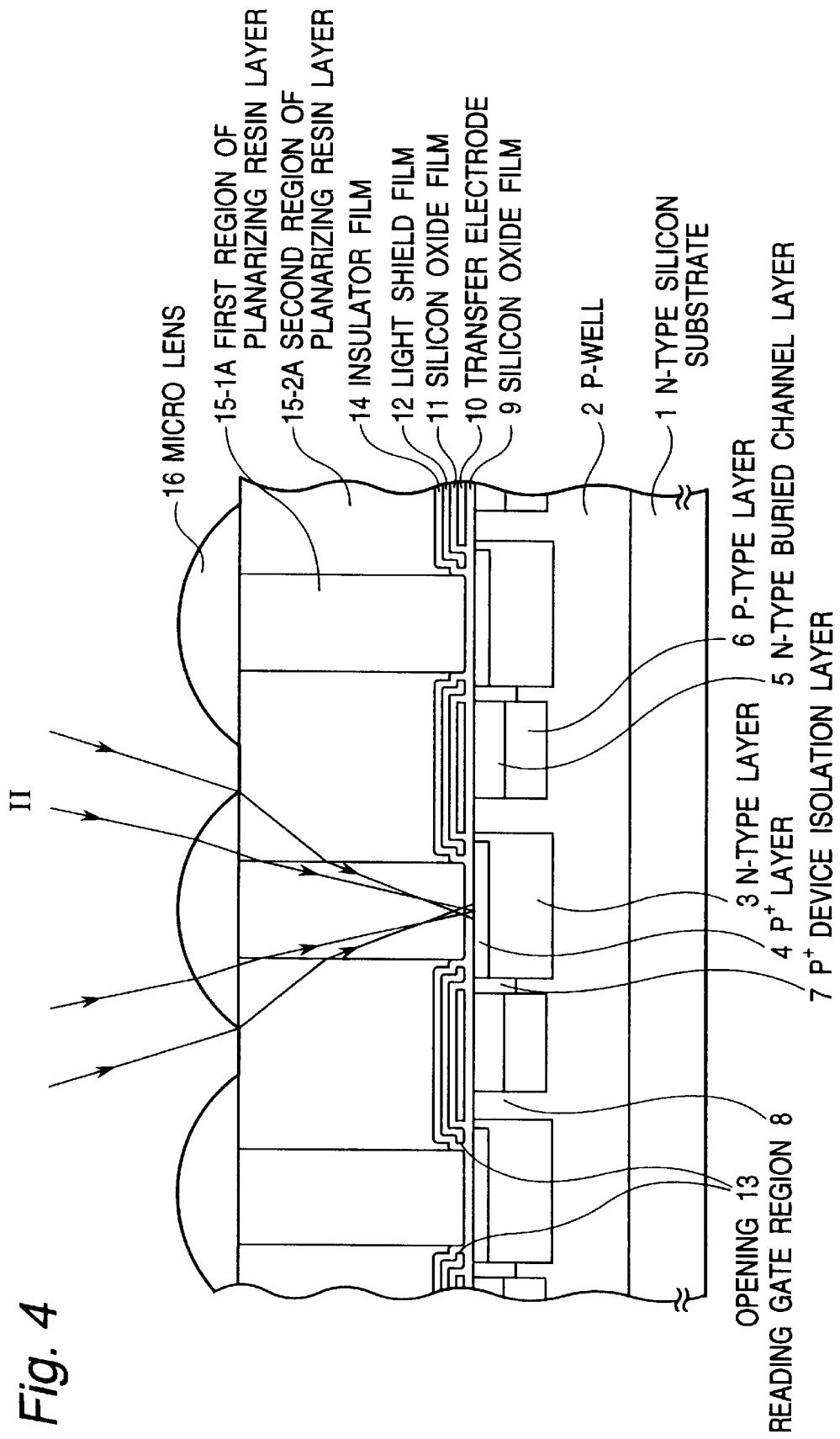
FIG. 4 is a diagrammatic sectional view of the first embodiment of the solid state image pick-up device for illustrating a light path different form that shown in FIG. 3.

FIG. 4 is a diagrammatic sectional view of the first embodiment of the solid state image pick-up device for illustrating a light path different from that shown in FIG. 3. Light from an object to be viewed is collected and focused by a camera lens. At this time, the angle of the incident light entering the image pick-up device is different dependently upon the aperture stop of the camera lens (F-number). If the aperture stop of the camera lens is narrowed (large F-number), the incident light is near to the collimated light, and therefore, the incident light "I" enters within the opening 13 of the light shield film, as shown in FIG. 3. The light collected by a peripheral portion of the micro lens passes through a boundary between the first region 15-1A and the second region 15-2A having the different refractive indexes, namely, refracts at the boundary, with the result that the light entering the photodiode opening becomes near to the perpendicular entrance.

On the other hand, when the aperture stop of the camera lens is made near to the full-open condition (small F-number), a slant light component of the incident light until it enters the image pick-up device, increases as shown by Reference Numeral "II" in FIG. 4. Similarly to the case that the aperture stop of the camera lens is narrowed (large F-number), the incident light is collected and focused by the micro lens, and the light passing through the peripheral portion of the micro lens passes through the boundary between the first region 15-1A and the second region 15-2A, so that the light entering the photodiode opening becomes near to the perpendicular entrance. As a result, the amount of light leaking into the N-type buried channel layer 5 becomes small, so that the deterioration due to the smearing is minimized.

Incidentally, in this embodiment, there occurs the reflection at the boundary between the planarizing resin layers having different refractive indexes, which was a problem in the second prior art example shown in FIG. 2. In this embodiment, it is sure that the light passing through the peripheral portion of the micro lens is subjected to reflection at the boundary between the first and second regions (of the planarizing resin layer) having different refractive indexes. However, a major portion of the incident light passing through the micro lens, namely, light passing through the center portion of the micro lens and therefore near to a perpendicular incident light, directly enters the first region 15-1A, and therefore, is not subjected to the reflection. Accordingly, the light reaching the photodiode is not attenuated similarly to the second prior art example shown in FIG. 2. In other words, drop of sensitivity can be minimized.

Now, a process of manufacturing the first embodiment of the solid state image pick-up device in accordance with the present invention will, be described with reference to FIGS. 5A, 5B and 5C, in which elements corresponding to those shown in FIG. 3 are given the same Reference Numeral.

As shown in FIG. 5A, boron is ion-implanted to the N-type silicon substrate 1, to form the P-type well 2. After a photoresist pattern is formed on the principal surface of the silicon substrate, phosphorus is ion-implanted to form the N-type layer 3 of the photodiode within the P-type well 2. Furthermore, by using another photoresist pattern, boron is ion-implanted to form the P-type layer 6 of the vertical CCD register, and by using still another photoresist pattern, phosphorus is ion-implanted to form the N-type buried channel layer 5 of the vertical CCD register. In addition, boron is ion-implanted to the reading gate region 8 (for reading out the electric charge stored in the N-type layer 3 to the vertical CCD register) for adjusting a threshold level.

Furthermore, boron is ion-implanted with a low energy and a high dose, to form the P$^+$ device isolation layer 7. Thereafter, the silicon oxide film 9 is formed on the N-type buried channel layer 5, and the transfer electrode 10 of the vertical CCD register is formed on the silicon oxide film 9. In addition, another silicon oxide film 11 is formed on the transfer electrode 10, and the light shield film 12 is formed to cover the silicon oxide film 11. The light shield Elm 12 is selectively etched to form the opening 13 above each photodiode.

Thereafter, a photosensitive first planarizing resin layer 15-2Aa is formed to cover the principal surface of the semiconductor substrate by means of for example a spin coating, as shown in FIG. 5A, and then, is selectively exposed to form holes 17 which pass through the first planarizing resin layer 15-2Aa and each of which is in alignment with a corresponding opening 13 of the light shield film, as shown in FIG. 5B.

Figure 5C:
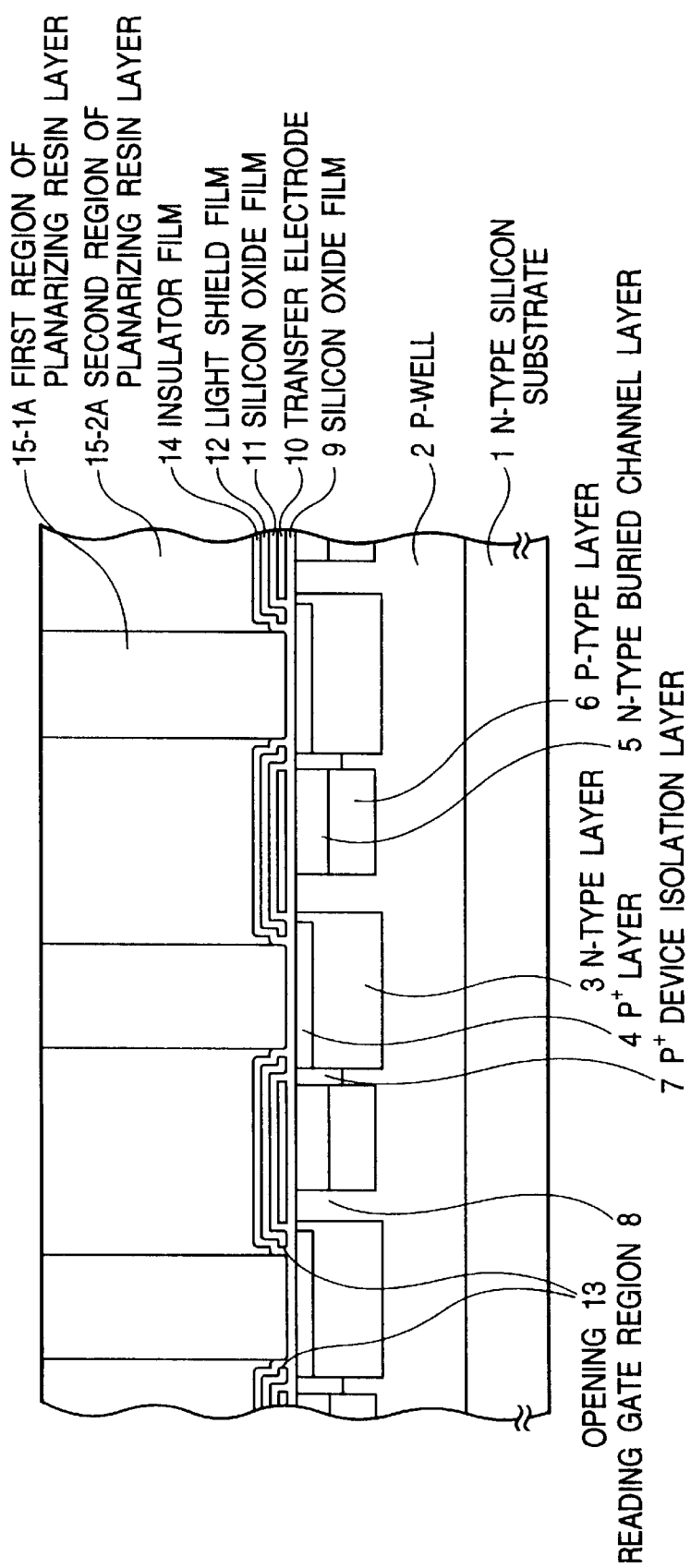

Furthermore, a second resin having a low viscosity and the refractive index smaller than that of the first resin layer 15-2Aa, is deposited by means of for example a spin coating, to fill the holes 17, as shown in FIG. 5C. Thus, the second region 15-1A is formed. Thereafter, the micro lens 16 are formed in a conventional manner as shown in FIG. 3.

As regards the planarizing resin layer, the refractive index can be controlled in the range of 1.4 to 1.65, by mixing a curing agent or an additive to a positive photoresist of an i-line phenol Novorak type. Alternatively, PGMA or PMMA for a deep UV or EB having the refractive index of 1.5, or a water-soluble resin such as casein, gelatin and glue (refractive index of 1.5 to 1.6) can be used.

Now, referring to FIG. 6, there is shown a diagrammatic sectional view of a second embodiment of the solid state image pick-up device in accordance with the present invention. In FIG. 6, elements corresponding to those shown in FIG. 3 are given the same Reference Numerals, and explanation thereof will be omitted for simplification of description.

As seen from comparison between FIGS. 3 and 6, the second embodiment is similar to the first embodiment in that a first region 15-1B directly under the center portion of the micro lens 16 has the refractive index $n_1$, but different from the first embodiment in that the second region is composed of a lower film 15-2B1 having the refractive index $n_2$, ($>n_1$)

and an upper film 15-2B2 having the same refractive index $n_1$ as that of the first region 15-1B.

Figure 7:
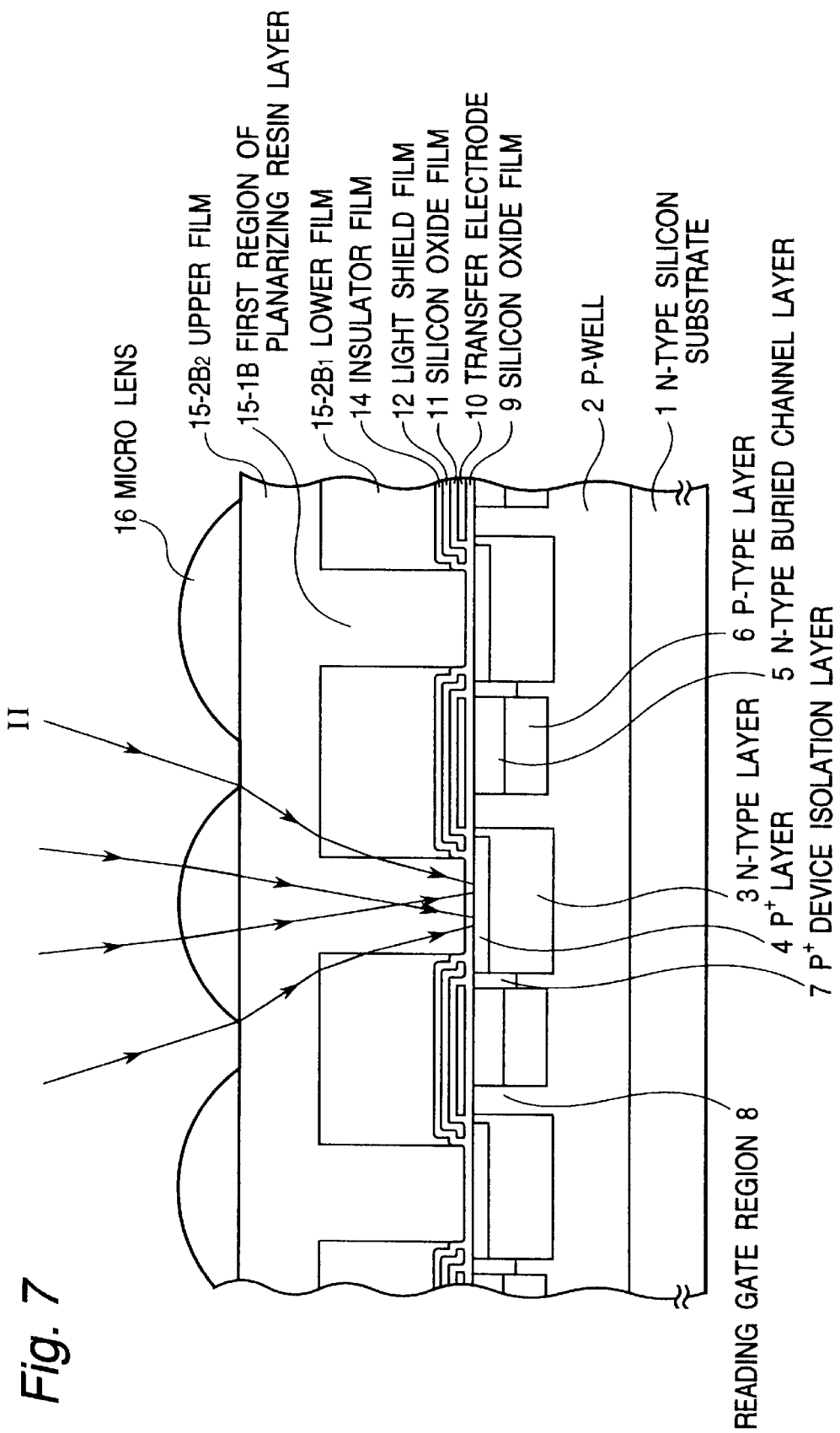
FIG. 7 is a diagrammatic sectional view of the second embodiment of the solid state image pick-up device for illustrating a light path different form that shown in FIG. 6.

FIG. 7 is a diagrammatic sectional view of the second embodiment of the solid state image pick-up device for illustrating a light path different form that shown in FIG. 6. As seen from comparison between FIGS. 6 and 7, regardless of whether the incident light is the collimated incident light "I" or the slant incident light "II", the light passing through the peripheral portion of the micro lens 16 passes through the boundary between the layers having different refractive indexes, two times, but the incident light enters to the photodiode in the form near to the perpendicular entrance.

Next, a process of manufacturing the second embodiment of the solid state image pick-up device in accordance with the present invention will be described with reference to FIGS. 8A, 8B and 8C.

Figure 8A:
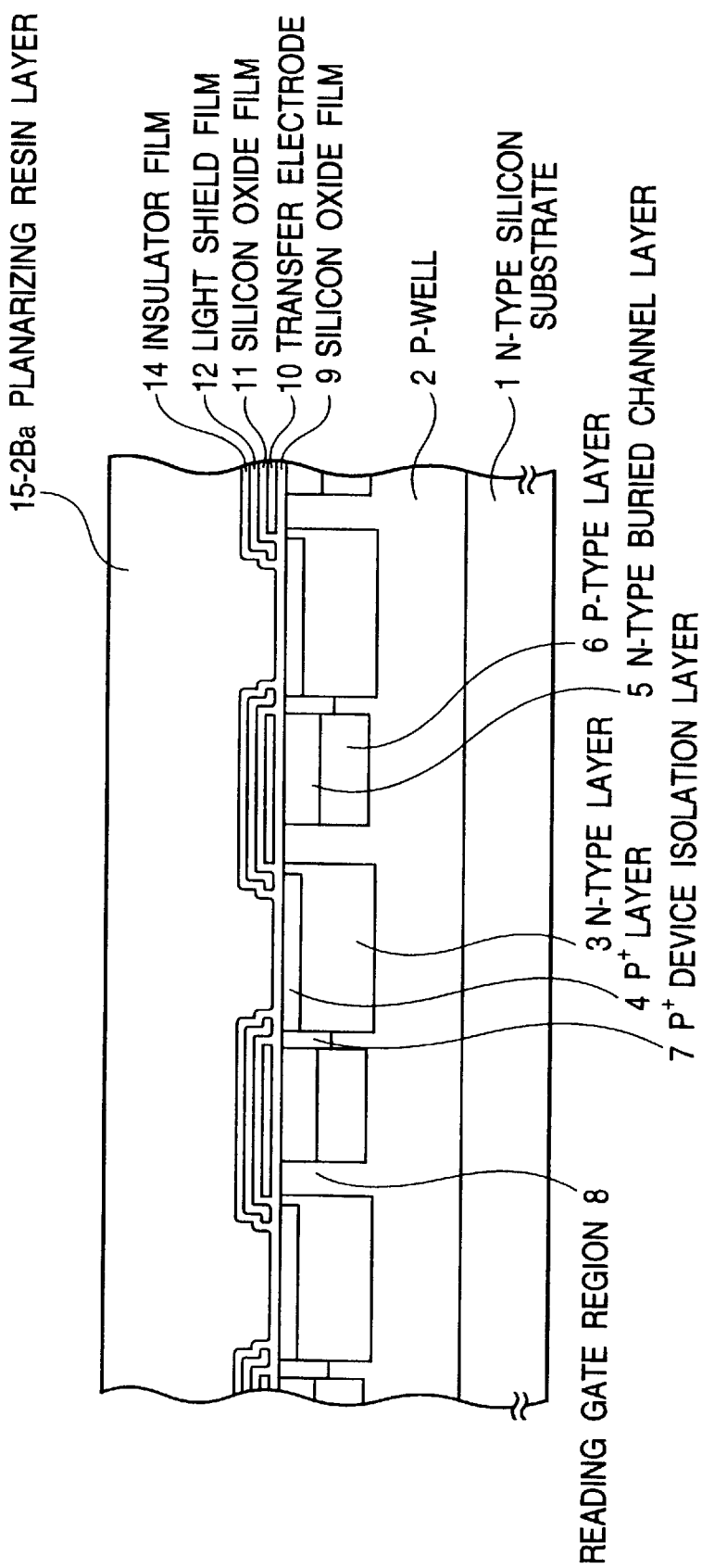
Figure 8B:
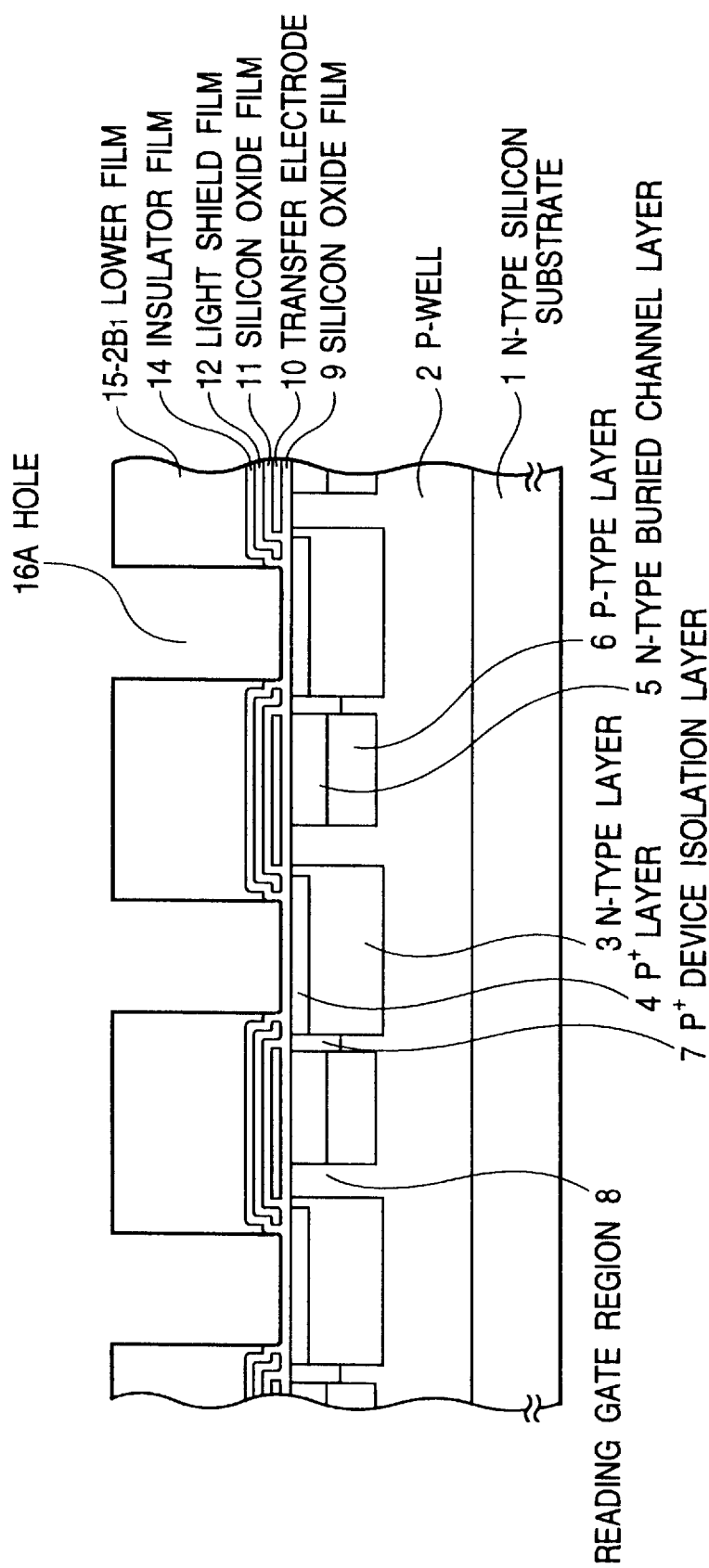

Similarly to the process explained with reference to FIG. 6A, as shown in FIG. 8A, a planarizing resin layer 15-2Ba having the refractive index $n_2$ is formed with a thickness smaller than the resin layer 15-2Aa. Then, as shown in FIG. 8B, holes 16A are formed to penetrate through the planarizing resin layer 15-2Ba, and as shown in FIGS. 8C, a planarizing resin layer 15-1B having the refractive index $n_1$ is formed not only to fill the holes 16A but also to cover the whole of the underlying film 15-2B. Succeedingly, the micro lens 16 are formed as shown in FIG. 6.

In the second embodiment, the aspect ratio of the holes 16A filled with the upper layer film 15-2B2 is small. Therefore, it is possible to easily fill the holes 16A with a resin having the refractive index smaller than that of the first region 15-1A in the first embodiment. In addition, since it is possible to uniformly fill all the holes, the production yield can be elevated.

As mentioned above, according to the present invention, in the planarizing resin layer between the micro lens and the substrate, the first region directly under the center portion of the micro lens is surrounded by the second region having the refractive index higher than that of the first portion, the light passing through the center portion of the micro lens enters the photoelectric conversion element without passing through the boundary between the planarizing resin layers having different refractive indexes. Therefore, there is no attenuation of the incident light caused by the reflection at the boundary between the planarizing resin layers having different refractive indexes. Therefore, there is no drop of sensitivity in the center portion of the photoelectric conversion element. On the other hand, since the slant light passing through the peripheral portion of the micro lens is refracted when the light passes from the second region having a relative large refractive index to the first region having a relative small refractive index, generation of the smearing is minimized. Therefore, drop of sensitivity because of the smearing can be reduced.

The invention has thus been shown and described with reference to the specific embodiments. However, it should be noted that the present invention is in no way limited to the details of the illustrated structures but changes and modifications may be made within the scope of the appended claims.

I claim:

1. A solid state image pick-up device comprising:
  a semiconductor substrate having a principal surface and a pixel array composed of a plurality of photoelectric conversion elements formed on said principal surface in the form of an array and transfer means located adjacent to said array of said photoelectric conversion elements for reading out a signal electric charge from each of said photoelectric conversion elements to transferring the read-out signal electric charge through said transfer means;

a planarizing resin layer covering said principal surface of said semiconductor substrate; and a plurality of micro lens formed on said planarizing resin layer, each of micro lens being positioned to correspond to one of said photoelectric conversion elements, said planarizing resin layer being composed of a first region of a first refractive index sandwiched between each of said micro lens and the corresponding photoelectric conversion element, and a second region surrounding said first region, said second region including a portion having a second refractive index larger than said first refractive index.

2. A solid state image pick-up device claimed in claim 1 wherein said second region is composed of only said portion having said second refractive index larger than said first refractive index.

3. A solid state image pick-up device claimed in claim 1 wherein said second region is composed of a lower layer portion at the side of said semiconductor substrate and an upper layer portion at the side of said micro lens, said lower layer portion having said first refractive index and said upper layer portion having said second refractive index.

4. A method for manufacturing a solid state image pick-up device, comprising the steps of:

preparing a semiconductor substrate having a principal surface and a pixel array composed of a plurality of photoelectric conversion elements formed on said principal surface in the form of an array and transfer means located adjacent to said array of said photoelectric conversion elements for reading out a signal electric charge from each of said photoelectric conversion elements to transferring the read-out signal electric charge through said transfer means;

forming a first resin layer having a predetermined refractive index and covering said principal surface of said semiconductor substrate;

selectively removing said first resin layer to form a plurality of holes each of which passes through said first resin layer to reach the corresponding photoelectric conversion element;

forming a second resin layer having a refractive index smaller than said predetermined refractive index, at least to fill said plurality of holes, so that a planarizing resin layer is formed of said first and second resin layers; and forming a plurality of micro lens on said planarizing resin layer in such a manner that each of said micro lens is positioned in alignment with the corresponding hole and therefore the corresponding photoelectric conversion element.

5. A method claimed in a claim 4 wherein said second resin layer is formed to cover a surface of said first resin layer other than said holes formed in said first-resin layer.

* * * * *